United States Patent
Wakamatsu et al.

(10) Patent No.: US 9,744,754 B2
(45) Date of Patent: Aug. 29, 2017

(54) METHOD FOR MANUFACTURING LIGHT DISTRIBUTION MEMBER, AND METHOD FOR MANUFACTURING LIGHT EMITTING DEVICE

(71) Applicant: NICHIA CORPORATION, Anan-shi, Tokushima (JP)

(72) Inventors: Dai Wakamatsu, Tokushima (JP); Masatsugu Ichikawa, Tokushima (JP)

(73) Assignee: Nichia Corporation, Anan-shi (JP)

( * ) Notice: Subject to any disclaimer, the term of this patent is extended or adjusted under 35 U.S.C. 154(b) by 339 days.

(21) Appl. No.: 14/543,382

(22) Filed: Nov. 17, 2014

(65) Prior Publication Data

US 2015/0136306 A1 May 21, 2015

(30) Foreign Application Priority Data

Nov. 18, 2013 (JP) ................. 2013-237837

(51) Int. Cl.
*B44F 1/00* (2006.01)
*C09K 11/00* (2006.01)
(Continued)

(52) U.S. Cl.
CPC ............ *B32B 38/0004* (2013.01); *G02B 5/00* (2013.01); *H01L 25/0753* (2013.01);
(Continued)

(58) Field of Classification Search
CPC ....... H01L 2924/12041; H01L 25/0753; H01L 2933/0041; H01L 33/50; H01L 33/501; H01L 33/508; B32B 38/0004; B32B 2307/412; B32B 2307/422; B32B 2551/00; B32B 37/02; F21S 48/12; F21S 48/1225
USPC ..... 156/60, 67, 90, 182, 250, 254, 256, 264; 428/411.1, 412, 426, 428, 432, 433, 434; 257/E33.055, E33.056, E33.057, E33.059, 257/E33.06, E33.061, E33.067, 99, 88, 257/98; 313/498, 512; 362/317, 341, 362/346
See application file for complete search history.

(56) References Cited

U.S. PATENT DOCUMENTS 3,669,789 A * 6/1972 Ohta et al. ....... B29D 11/00663
156/151
6,252,243 B1 6/2001 Isoda et al.
(Continued)

FOREIGN PATENT DOCUMENTS

JP 48-037852 B 11/1973
JP 2000-155199 A 6/2000
(Continued)

*Primary Examiner* — Philip Tucker
*Assistant Examiner* — Brian R Slawski
(74) *Attorney, Agent, or Firm* — Global IP Counselors, LLP

(57) ABSTRACT

A method for manufacturing a light distribution member has steps of providing a plurality of first light blocking film members, each of which including a first light blocking film covering a surface of a light-transmissive board, bonding a plurality of first light blocking film members, such that each first light blocking film is sandwiched between light-transmissive boards of adjacent first light blocking film members, to form a first bonded body, and cutting the first bonded body in a direction perpendicular to a lamination surface of the first light blocking film members so as to form a plurality of slices.

16 Claims, 6 Drawing Sheets

(51) Int. Cl.

| | | |
|---|---|---|
| *H01J 9/227* | (2006.01) | |
| *B32B 37/00* | (2006.01) | |
| *B29C 65/00* | (2006.01) | |
| *B32B 38/04* | (2006.01) | |
| *B32B 9/00* | (2006.01) | |
| *B32B 17/06* | (2006.01) | |
| *B32B 15/00* | (2006.01) | |
| *H01L 29/18* | (2006.01) | |
| *H01L 33/00* | (2010.01) | |
| *B32B 38/00* | (2006.01) | |
| *G02B 5/00* | (2006.01) | |
| *H01L 25/075* | (2006.01) | |
| *B32B 37/18* | (2006.01) | |
| *H01L 33/50* | (2010.01) | |
| *B32B 37/02* | (2006.01) | |
| *H01L 33/58* | (2010.01) | |

(52) U.S. Cl.
CPC .............. *B32B 37/02* (2013.01); *B32B 37/18* (2013.01); *B32B 2307/41* (2013.01); *B32B 2307/412* (2013.01); *B32B 2307/416* (2013.01); *B32B 2307/422* (2013.01); *B32B 2551/00* (2013.01); *H01L 33/501* (2013.01); *H01L 33/58* (2013.01); *H01L 2924/0002* (2013.01); *H01L 2924/12041* (2013.01); *H01L 2933/0041* (2013.01); *H01L 2933/0058* (2013.01); *Y10T 156/1052* (2015.01)

(56) References Cited

U.S. PATENT DOCUMENTS

| | | |
|---|---|---|
| 2011/0121731 A1 | 5/2011 | Tsutsumi et al. |
| 2012/0007131 A1 | 1/2012 | Ueno et al. |
| 2012/0236582 A1* | 9/2012 | Waragaya ............ H01L 33/507 362/510 |
| 2013/0170179 A1* | 7/2013 | Kadomi ................ C09K 11/02 362/84 |
| 2013/0329440 A1* | 12/2013 | Tsutsumi ................ H01L 24/97 362/465 |

FOREIGN PATENT DOCUMENTS

| | | | |
|---|---|---|---|
| JP | 2008-209520 A | 9/2008 | |
| JP | 2010-046696 A | 3/2010 | |
| JP | 2010-263050 A | 11/2010 | |
| JP | 2011-108589 A | 6/2011 | |
| JP | 2012-084930 A | 4/2012 | |
| JP | 2012-169189 A | 9/2012 | |
| JP | 2012-527742 A | 11/2012 | |
| JP | 2013-187371 A | 9/2013 | |
| JP | 2012-119407 A | 6/2014 | |
| WO | 2012-066881 A1 | 5/2012 | |
| WO | WO 2012066881 A1 * | 5/2012 | ............ C09K 11/02 |
| WO | 2012-111292 A1 | 8/2012 | |
| WO | WO 2012111292 A1 * | 8/2012 | ............ H01L 33/50 |

* cited by examiner

METHOD FOR MANUFACTURING LIGHT DISTRIBUTION MEMBER, AND METHOD FOR MANUFACTURING LIGHT EMITTING DEVICE

CROSS-REFERENCE TO RELATED APPLICATIONS

This application claims priority to Japanese Patent Application No. 2013-237837 filed on Nov. 18, 2013. The entire disclosure of Japanese Patent Application No. 2013-237837 is hereby incorporated herein by reference.

BACKGROUND

Technical Field

The present invention relates to a method for manufacturing a light distribution member, and to a method for manufacturing a light emitting device.

Description of the Related Art

Light emitting devices having light emitting diodes or other such light emitting elements have been used in recent years as the light source for automotive headlights. With a light emitting device used in automotive headlights, a plurality of light emitting elements are arranged on a single substrate, and wavelength conversion members containing a fluorescent material are disposed on these light emitting elements (see JP 2012-119407A and JP2012-527742A, for example).

With a light emitting device such as this that has a plurality of light emitting elements, however, when the individual light emitting elements are controlled to be lit separately, if there is an unlit light emitting element adjacent to a lit light emitting element, light may leak out from the lit light emitting element, and there may be a minute amount of light-emission from the unlit light emitting element.

To prevent this light leakage, a method has been proposed in which a reflective resin containing titanium oxide is disposed between adjacent wavelength conversion members. To form the reflective resin, however, there has to be enough space between the wavelength conversion members. This space contributes to a darkening of the field of the light emitting elements when adjacent light emitting elements emit light simultaneously.

There is also a method in which a flat wavelength conversion member is diced into smaller pieces, after which a light blocking film composed of a metal film or a dielectric laminated film is formed on the side faces of these wavelength conversion members. However, the side faces produced by dicing have an uneven surface, which means that the light blockage or reflecting effect is not adequately obtained. Furthermore, it is not easy to control the thickness of the metal film or dielectric laminated film formed on the side faces, and it is difficult to form a uniform film on the side faces.

Also, there has been a proposal in which finely-processed triangular prisms made from silicon are disposed between adjacent light emitting elements, and the side faces of the wavelength conversion members corresponding to the individual light emitting elements are coated with silver paste, which prevents light from leaking out from adjacent light emitting elements (see JP 2012-169189A, for example).

However, since numerous light emitting elements are arranged in a row or a matrix in the light emitting devices used in automotive headlights, not only do a step of disposing triangular prisms between individual light emitting elements, a step of coating the side faces of the wavelength conversion members corresponding to the individual light emitting elements with silver paste, and so forth require sophisticated processing technology, but the manufacturing process may be made more complicated.

SUMMARY

The present invention is conceived in light of the above problem, and it is an object thereof to provide a method for manufacturing a light distribution member, and a method for manufacturing a light emitting device, with which a light emitting device that does not decrease the emission efficiency, allows a uniform brightness to be obtained, and can prevent light leakage between lit and unlit light emitting elements can be manufactured easily and precisely.

The present disclosure provides a method for manufacturing a light distribution member, having providing a plurality of first light blocking film members, each of which including a first light blocking film covering a surface of a light-transmissive board, bonding a plurality of first light blocking film members, such that each first light blocking film is sandwiched between light-transmissive boards of adjacent first light blocking film members, to form a first bonded body, and cutting the first bonded body in a direction perpendicular to a lamination surface of the first light blocking film members so as to form a plurality of slices.

Further, the present disclosure provides a method of manufacturing a light emitting device, having manufacturing a light distribution member of the above, disposing light emitting elements separately with respect to light-transmissive pieces that have been demarcated by the first light blocking films in the light distribution member, and disposing reflecting layers made from a material that is different from that of the first light blocking film between the light emitting elements.

According to the present disclosure, it is possible to provide a method for manufacturing a light distribution member, and a method for manufacturing a light emitting device, with which a light emitting device that does not decrease the emission efficiency, allows a uniform brightness to be obtained, and can prevent light leakage between lit and unlit light emitting elements can be manufactured easily and precisely.

DETAILED DESCRIPTION

Figure 1A:
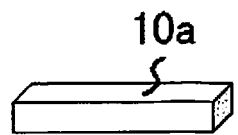
FIG. 1A(a) to FIG. 1A(d) is a manufacturing processing diagram showing the method for manufacturing a light distribution member of according to an embodiment of the present invention.
Figure 1A:
Figure 1A:
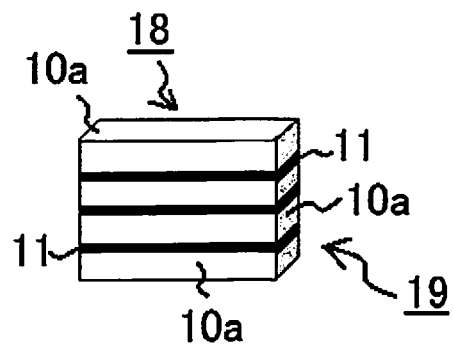
Figure 1A:
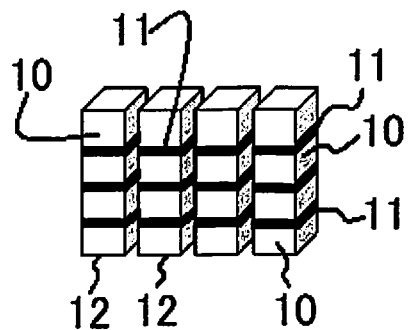

In the present disclosure, the sizes and the arrangement relationships of the members in each of drawings are occasionally shown exaggerated for ease of explanation.

In the description below, the same designations or the same reference numerals may, in principle, denote the same or similar members and duplicative descriptions will be appropriately omitted.

Further, constitutions described in one example and one embodiment can be employed in other examples and embodiments.

Method for Manufacturing Light Distribution Member (a) Preparation of First Light Blocking Film Member First, a plurality of first light blocking film members are prepared. Each of first light blocking film includes a first light blocking film covering a surface of a light-transmissive board.

The light-transmissive boards used here can be either flexible or rigid, so long as they are plate-like members that are light-transmissive. Here, "light-transmissive" refers to allowing penetration of light, which is 60% or greater, and further preferably allows penetration of 70% or greater, 80% or greater, or 90% or greater of the light that is supposed to be distributed, such as the light emitted from the light emitting elements.

Such light-transmissive board can be formed by a material such as a resin, for example, a silicone resin, a modified silicone resin, an epoxy resin, a modified epoxy resin, phenolic resin, polycarbonate resin, acrylic resin, polymethylpentene (TPX) resin, polynorbornene resin, or hybrid resin containing one or more of these resins, and glass and the like.

The light-transmissive board can contain a fluorescent material, filler, or the like so long as it is light-transmissive.

For the fluorescent material contained in the fluorescent material layer, a known fluorescent material known in the art can be employed. Example of the fluorescent material includes, for example, a yttrium aluminum garnet (YAG) fluorescent material activated by cerium, Lutetium aluminum garnet (LAG) fluorescent material activated by cerium, a calcium aluminosilicate containing nitride fluorescent material activated by europium and/or chromium (CaO—$Al_2O_3$—$SiO_2$), a silicate fluorescent material activated by europium $(Sr, Ba)_2SiO_4)$, beta sialon fluorescent material, KSF fluorescent material ($K_2SiF_6$:Mn), minute semiconductor particles that are termed quantum dot fluorescent material, and the like.

When the light-transmissive board contains the fluorescent material, it preferably contains 5 to 50% with respect to the total weight of the light-transmissive board.

Examples of the filler (diffusing agent, colorant, for example) include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals or sintered body of the fluorescent material, sintered body of the fluorescent material and inorganic binder, and the like.

There are no particular restrictions on the thickness or size of the light-transmissive boards, which can be suitably adjusted according to the light distribution member to be obtained. For example, the thickness corresponds to the spacing between light emitting elements and/or the size of the light emitting elements in use as a light distribution member of a light emitting device, and is preferably the same as or slightly greater than the length of one side of a light emitting element. More specifically, the thickness can range from 100 μm to a few millimeters, for example, preferably about 100 μm to 1000 μm, and more preferably 100 μm to 500 μm. Consequently, when the resulting light distribution member is used in a light emitting device, the light emitting device can be made even more compact, and furthermore even higher brightness will be obtained.

There are no particular restrictions on the shape of the light-transmissive boards, but the planar shape is preferably quadrangular (square or rectangular), for example.

The first light blocking film formed on the surface of the light-transmissive boards is preferably formed from a material capable of blocking at least 80% of the light from the light emitting elements, in the form of a thin-film. Examples include a DBR (distributed Bragg reflector) composed of a dielectric laminated film in which two or more types of dielectric are laminated in a plurality of layers, or a single layer or a laminated film of gold, Silver, copper, iron, nickel, chromium, aluminum, titanium, tantalum, tungsten, silicon, cobalt, ruthenium, tin, zinc, lead or another such metal or an alloy of these (for instance, as an aluminum alloy, this would be an alloy of aluminum and copper, silver, platinum, or another such platinum series metal).

Examples of the dielectrics constituting a film with a DBR construction (a DBR film) include oxides or nitrides containing at least one element selected from a group comprising silicon titanium, zirconium, niobium, tantalum, aluminum. With a laminated film of dielectrics, when n1 is the refractive index of one dielectric, n2 is the refractive index of the other dielectric, and λ is the wavelength of light emitted from the light emitting layer, then the thickness d1 of the one dielectric and the thickness d2 of the other dielectric preferably satisfy the following.

$$d1=\lambda/(4n1) \quad (1)$$

$$d2=\lambda/(4n2) \quad (2)$$

There are no particular restrictions on the thickness of the first light blocking film, but examples include a range of about a few tenths of a micron to a few dozen microns, and preferably a range of about 1 to a few dozen microns, and more preferably a range of about 1 to 10 μm.

The first light blocking film can be formed by a known method, such as vacuum vapor deposition, ion plating, ion vapor deposition (IVD), sputtering, ECR sputtering, plasma deposition, chemical vapor deposition (CVD), ECR-CVD method, ECR-plasma CVD method, electron beam evaporation (EB) method, atomic layer deposition (ALD) method.

The first light blocking film can be formed on just one surface of the light-transmissive boards, but is preferably formed on two surfaces located on the opposite sides from each other. Also, the first light blocking film is preferably formed over the entire surface of the light-transmissive boards, and more preferably is formed in a uniform thickness overall, but can instead be formed only locally (such as in a lattice pattern, an island pattern, or a stripe pattern).

When a plurality of the first light blocking film members are prepared, they may have different planar shapes and thicknesses, but their planar shape and thickness are preferably the same or substantially the same. The term "substantially" here means that variance of about ±10% is allowed.

After the first light blocking film has been formed on a light-transmissive board, the first light blocking film member can be cut, polished, or the like to achieve the desired shape, size, etc.

In the next step, when the first light blocking film member is bonded using an atomic diffusion bonding type of room temperature (i.e., normal-temperature) bonding process, the first light blocking film can be formed as a microcrystalline thin-film. In this case, the surface of the light-transmissive boards is preferably smoothed before the formation of the first light blocking film.

(b) Formation of First Bonded Body

A first bonded body is formed by bonding a plurality of first light blocking film members, such that each first light blocking film is sandwiched between light-transmissive boards of adjacent first light blocking film members.

The bonding here can be accomplished by using an adhesive agent or the like, or by using fusion bonding involving heating of the first light blocking film, but it is preferable to laminate a plurality of first light blocking film members, such that the first light blocking film of one first light blocking film member is in contact with the first light blocking film of another first light blocking film member to bond the plurality of first light blocking film members by a room temperature bonding process. The bonded surface of the first light blocking films will hereinafter be referred to as the "lamination surface".

A known method can be used for the room temperature bonding. For example, this can be a surface activated bonding type of room temperature bonding process, or an atomic diffusion bonding type of room temperature bonding process. When a room temperature bonding such as this is used, bonding is possible without the use of an adhesive agent, heat, pressure, or the like, so a strong bonding can be obtained without having to take into account the difference in the coefficients of thermal expansion between the two members being bonded. Also, since the bonding occurs at the atomic level, the bonding is stronger than with bonding by an adhesive agent or the like, and the bonding will have excellent durability. Furthermore, since heating is not included, there is no need to raise or lower the temperature, meaning that the bonding can be completed in less time.

With a surface activation bonding type of room temperature bonding, the bonding surfaces are subjected to surface processing in a vacuum, resulting in an active state that lends itself to the formation of chemical bonds at the atoms on the surface. More specifically, first any oxide film, dirt, or the like adhering to the bonding surface is removed by irradiation with a plasma, or other ions of argon, or the like. The energy, time, and so forth in this case can be suitably adjusted according to the thickness, the material, and the like of the first light blocking film of the first light blocking film member being used. This processing results in atoms having chemical bonds being exposed at the bonding surface of the first light blocking film member, thus forming an extremely active state with high bonding strength with other atoms. Consequently, the bonding surfaces can be brought into contact, either with or without pressure being applied, so that the bonding strength comes into play instantly, securely bonding the bonding surfaces together. With bonding such as this, no thermal distortion or stress is caused by heating, so a stable bonded body can be obtained for the first light blocking film in the form of an extremely thin film.

With an atomic diffusion bonding type of room temperature bonding, a microcrystalline film is formed in an ultra-high vacuum at the bonding surfaces, and these thin-films are superposed under vacuum, allowing the bonding surfaces to be bonded at room temperature. Usually, in atomic diffusion bonding, a metal film is formed that corresponds to at least a one-atom layer per side (one bonding surface of the bonded members), so that metal atoms adhere to all of both bonding surfaces. As well as to smooth the bonding faces of the bonded members, it is preferable to set the thickness of metal film to be at least a few nanometers to allow the uniform in-plane thickness of the metal film, so that there will be as few voids as possible at the interface where the bonded members are superposed at the bonding faces.

In the bonding of the first light blocking film members, the first light blocking film member located at the very end can be one in which first light blocking films are formed on both sides, but it is preferable to use a first light blocking film member in which the film is formed on only one side, so that the first light blocking film will not be disposed at the very end surface. Also, the first light blocking film members disposed on the inside of the first bonded body can be ones in which the first light blocking films are formed on only one side, but it is preferable to use first light blocking film members in which the first light blocking film is formed on both sides, in order to facilitate bonding on both sides.

In any case, the first bonded body can be formed by bonding the first light blocking film members so as to sandwich one or both of the first light blocking films. There are no particular restrictions on the number of laminated layers of the first light blocking film members in the first bonded body, but examples include two or more, three or more, four or more, and five or more. Other examples include a hundred or fewer, a few dozen or fewer, and about a dozen or fewer.

(c) Slicing of First Bonded Body

A plurality of slices of the resulting first bonded body are obtained by cutting. The cutting here is preferably performed in a direction perpendicular to the lamination surface of the first light blocking film members. This cutting will hereinafter be referred to as the first cutting.

Any kind of cutting can be used as long as it is perpendicular to the lamination surface of the first light blocking film members, but a cutting method in which the cutting surface is flat is preferred. Any method known in this field can be utilized for this cutting method. Examples include blade dicing and laser dicing. The term "perpendicular" as used in this Specification encompasses an inclination of ±10% from perpendicularity.

Cutting in which the cutting location (line) surfaces in various directions is possible within the lamination surface in the perpendicular direction with respect to the lamination surface of the first light blocking film members. Thus, in the case where the light-transmissive board is square, the cutting is preferably processed so as to obtain cut surfaces that are parallel to an end surface (the end surface 19 in FIG. 1A (c), for example) adjacent to the surface where the first light blocking film is formed (see FIG. 1A (d), for example). This one-time cutting can form a slice of the first bonded body of a uniform thickness (see FIG. 1B).

Figure 3A:
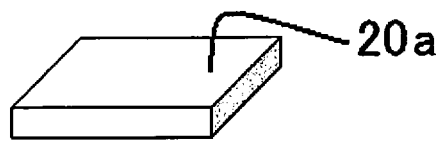
FIG. 3A(a) to FIG. 3A(d) is manufacturing processing diagram showing another embodiment of the method for manufacturing a light emitting device of the present invention.
Figure 3A:
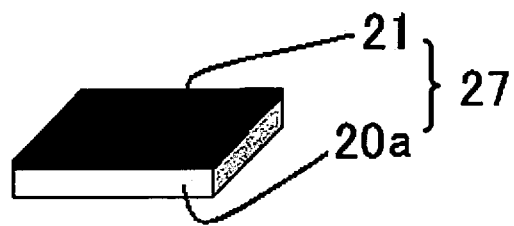
Figure 3A:
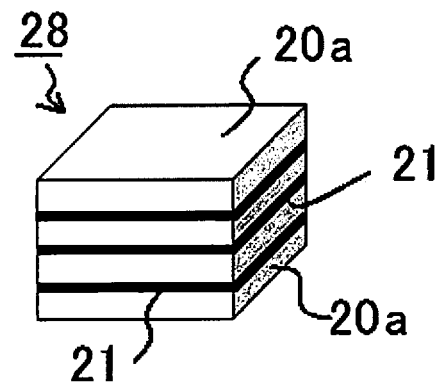
Figure 3A:
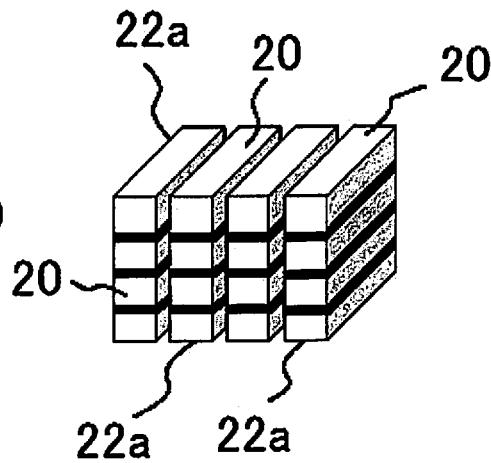

The desired light distribution member can be manufactured by making a single cut in a direction perpendicular to the lamination surface of the first light blocking film members, but a plurality of the desired light distribution members (see FIG. 1A (d) and FIG. 3A (d), for example) by processing two or more cuttings parallel to each other.

Figure 3B:
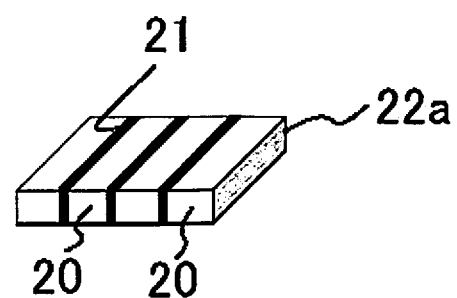
FIG. 3B(a) to FIG. 3B(b) is oblique view of another light distribution member obtained with the method for manufacturing a light distribution member of the present invention.
Figure 3B:
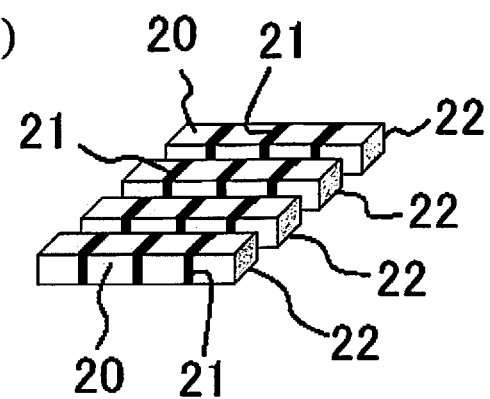

Also, depending on the planar shape of a single bonded body, as discussed above, cutting the light distribution member, which is obtained by making one or more first cuts that are parallel to each other in a direction perpendicular to the lamination surface of the first light blocking film members, can be processed further in a direction perpendicular to the lamination face of the first light blocking film members and intersects the first cut (preferably, perpendicularly), (see FIG. 3B (a) and (b)). Making these cuttings in two directions allow a plurality of light distribution members to be manufactured in the desired shape, regardless of the shape of the bonded body.

The slicing here is preferably processed so that a thickness of a slice is in about the same as the light-transmissive board being used, such as about 100 μm to a few millimeters, preferably about 100 μm to 1000 μm, and more preferably about 100 μm to 500 μm. This thickness can be achieved by polishing or the like after slicing.

In the embodiments according to the present invention, the cutting in this step may be performed at an angle inclined from perpendicularity, rather than in a direction perpendicular to the lamination face of the first light blocking film members. Such cutting can be utilized when manufacturing a light distribution member that is supposed to distribute light in a particular direction.

(d) Formation of Second Light Blocking Film Member

With the method for manufacturing a light distribution member of the present disclosure, a second light blocking film can be further formed on the cut surface of the sliced light distribution members obtained by the first cutting, as discussed above. That is, a second light blocking film is formed on the surface of the sliced light distribution members obtained in the first cutting regarding the sliced light distribution members as the above-mentioned light-transmissive board). This allows one or more second light blocking film members to be formed. Therefore, the second light blocking film can be formed so as to be in a direction perpendicular to the first light blocking film.

The second light blocking film can be formed by one of the known methods discussed above, from one of the materials listed as examples for the first light blocking film. It is especially preferable for the second light blocking film to be formed from the same material as the first light blocking film. This allows the various light emitting elements to have uniform light distribution characteristics when a plurality of light emitting elements are used, as discussed below. The second light blocking film need not have the same thickness as the first light blocking film, but from the standpoint of uniformity in light distribution characteristics, it is preferable for them to be the same.

(e) Formation of Second Bonded Body

The method for forming the second bonded body by bonding the second light blocking film members can be similar to the one used to form the first bonded body above. The number of layers of the second light blocking film member here can be set as desired.

(f) Slicing of Second Bonded Body

The second bonded body thus obtained is cut to form a plurality of slices. The cutting here can be similar to that used to obtain slices of the first bonded body. The slicing here may be in a direction perpendicular to the lamination surface of the second light blocking film member, but is preferably in a direction perpendicular to both the lamination surface of the first light blocking film member and the lamination surface of the second light blocking film member.

The slices of the light distribution member can be further cut according to the shape of the light-transmissive board, the number of layers of the first light blocking film member, the cutting state of the first bonded body, the number of layers of the second light blocking film member, and cutting state of the second bonded body, and so on, and thereby worked into the desired shape and the desired number of light-transmissive boards, first light blocking films, and second light blocking films. This allows the manufacture of a light distribution member corresponding to the number of light emitting elements to be applied.

Small pieces are obtained after the first bonded body is sliced in the first cutting, or after slicing by further cutting in a direction perpendicular to the first cutting, or after slicing by cutting the second bonded body. The obtained small pieces is in the state in which the light-transmissive boards have been demarcated by the first light blocking films and/or second light blocking films, and constituting the light distribution member. Such small pieces will hereinafter sometimes be referred to as "light-transmissive pieces" (see 10 in FIG. 1B, 20 in FIGS. 3B (a) and (b), and 20 in FIGS. 4A (c) and 4B).

Thus, depending on whether the first bonded body is sliced by the first cutting, or is further sliced by cutting in a direction perpendicular to the first cutting, or the second bonded body is sliced, a light distribution member that can block light between light-transmissive pieces can be easily and accurately manufactured. The light-transmissive pieces are of a uniform thickness that are cuboid (two- or three-dimensional) in shape, and are adjacent in the longitudinal and/or lateral direction.

Method for Manufacturing Light Emitting Device

Disposition of Light Emitting Elements

With the method for manufacturing a light emitting device of the present invention, the light distribution member formed by the method discussed above is used, and light emitting elements are disposed with respect to this light distribution member. The light distribution member is disposed on the light extraction face side of the light emitting elements, that is, on the light extraction face side of the light emitting device.

A plurality of light emitting elements are disposed, spaced apart respectively, with respect to the light distribution member, which has been demarcated by the first light blocking films, or by both the first light blocking films and second light blocking films.

For example, when using a light distribution member in which light-transmissive pieces demarcated by light blocking films are arranged in a row, a plurality of light emitting elements are arranged in a row corresponding to the light-transmissive pieces. When using a light distribution member in which light-transmissive pieces demarcated by light blocking films are arranged in a matrix, a plurality of light emitting elements are arranged in a matrix corresponding to the light-transmissive pieces. Consequently, the light distribution of the various light emitting elements can be controlled regardless of whether the light emitting elements being used are lit or not. Light leakage between adjacent light emitting elements can also be prevented. As a result, sight light emission of unlit light emitting elements can be prevented by the simple manufacturing method discussed above.

The plurality of arranged light emitting elements are preferably arranged close together between adjacent light emitting elements, and when automotive applications, and particularly brightness distribution and so forth are taken into account, the distance between light emitting elements is preferably shorter than the size of the light emitting elements themselves (such as their length along one side), and more preferably no more than about 30% of the size of the light emitting elements themselves, and even more preferably no more than 20%. Disposing the light emitting elements close together in this way results in a light emitting device that is a planar light source with high optical quality and little emission unevenness.

As to the layout of the light emitting elements with respect to the light distribution member, the light emitting elements can be disposed away from the light distribution member, but are preferably disposed close to or in contact with the light distribution member. This allows the light emitted on the light distribution member side (out of all the light emitted from at least the light emitting elements) to be efficiently guided to the light distribution member. The word "close" here means that the elements are disposed so that substantially only a member that contributes to adhesion between the elements (e.g., adhesive member) is between them.

Any light emitting elements that are commonly used in this field can also be used here. For example, a light emitting element emitting blue light or green light includes one where a material such as ZnSe, a nitride semiconductor ($In_XAl_YGa_{1-X-Y}N$ ($0 \leq X$, $0 \leq Y$, $X+Y \leq 1$)), and GaP is used as a semiconductor layer, and a light emitting element emitting red light includes one where a material such as GaAlAs, AlInGaP are used as a semiconductor layer. The light emitting elements can be ones in which electrodes are disposed on different sides of the semiconductor layer, but are preferably ones in which the electrodes are disposed on the same side. This allows face-down mounting, discussed below.

When the light emitting elements are spaced apart to each other corresponding to the above-mentioned light distribution member, then usually a plurality of light emitting elements are arranged in series, in parallel, in series-parallel, in parallel-series, or another such connection mode on a support substrate. The light emitting elements are mounted on a support substrate with wires or the like, or by a bonding member such as solder. The light emitting elements can be mounted in either face-down manner or face-up manner, but are preferably mounted in face-down manner. Such a mounting allows the light emitting elements to be disposed close to or in contact with the light distribution member, and allows the desired light distribution characteristics to be obtained with ease.

Disposition of Reflecting Layer

A reflecting layer is disposed between the light emitting elements. The reflecting layer can be made from a material that is different from that of the first light blocking film or the second light blocking film. As a reflecting layer here, one that reflects at least 60%, at least 70%, at least 80% or at least 90% of the light that is supposed to be distributed, such as the light emitted from the light emitting elements is preferably used.

There are no particular restrictions on the material of the reflecting layer, which can be selected from among those listed as examples for the first light blocking film, but when ease and accuracy of the deposition of the reflecting layer are taken into account, it is preferable to use a resin. Examples of this resin are similar to those listed as examples of the material of the light-transmissive board, and it is particularly preferable for these materials to contain a reflective substance so that light emitted from the light emitting elements will not be transmitted. Examples of the reflecting substance include titanium oxide, silicon oxide, zirconium oxide, potassium titanate, alumina, aluminum nitride, boron nitride, mullite and the like. The content of the reflective substance, etc., can be suitably adjusted according to the type of reflective substance being used and so forth. For example, the content is preferably at least about 30% with respect to the total weight of the reflecting layer. A white resin is especially preferred.

The reflecting layer preferably fills in the space bounded by the light distribution member and the adjacent light emitting elements, regardless of whether or not there is an adhesive member. Also, the reflecting layer is preferably disposed between the light emitting elements and so as to be in contact with the first light blocking film and/or second light blocking film in the light distribution member, at the surface on the light distribution member side. The contact here is preferably such that the entire first light blocking film and/or second light blocking film exposed on the light emitting element side of the light distribution member is in contact with the reflecting layer. Contact by both of these allows light emitted from the individual light emitting elements to be separated from one light emitting element to the next by the light distribution members on the light emitting elements and between light emitting elements, and prevents light leakage between adjacent light emitting elements within the light emitting device. As a result, slight light by unlit light emitting elements can be avoided.

The reflecting layer need not be disposed in contact with the side faces of the light emitting elements, but is preferably disposed so as to be in contact with all or part of the side faces. This disposition allows the light emitted laterally from the side faces of the light emitting elements to be reflected on the reflecting layer, and light to be extracted to the light extraction surface side. This also avoids light absorption by other members since the light propagates through only the light emitting elements.

The reflecting layer is preferably also disposed the surfaces on the opposite side to the light extraction surfaces of the light emitting elements, that is, between the light emitting elements and the above-mentioned support substrate. This disposition allows light to be extracted to the light extraction face side.

Furthermore, the reflecting layer preferably covers the entire end surface of the light distribution member in the case where the outer periphery of the light distribution member, that is, the end surface of the light distribution member, is not covered by the first light blocking film and/or the second light blocking film. Furthermore, the reflecting layer and the light distribution member are preferably such that the upper face of the reflecting layer and the upper face of the light distribution member are formed in the same plane, at the periphery of the light distribution member. This allows light emitted from the side faces of the light distribution member to be reflected and extracted to the light extraction surface.

The reflecting layer can be formed by screen printing, potting, transfer molding, compression molding, or the like.

The reflecting layer does not cover the surface of the light distribution member on the light extraction face side in the manufactured light emitting device, but processing can be performed to expose the light extraction surface of the light distribution member from the reflecting layer by polishing or the like after the surface of the light distribution member on the light extraction surface side is temporarily covered in the step of forming the reflecting layer. Therefore, the thickness of the reflecting layer is preferably equal to the total of the thickness of the light distribution member and the height of the light emitting elements when connected to the support substrate.

A light emitting device obtained with this manufacturing method has, for example, a sheet-form light distribution member; a plurality of light emitting elements; and a reflecting layer. Here, the sheet-form light distribution member has a first main surface and a second main surface that are parallel to each other and are located on mutually opposite sides.

Also, the sheet-form light distribution member has light-transmissive pieces and light blocking films disposed alternately with respect to a specific direction parallel to the first main face and second main face. A plurality of light emitting elements are spaced apart at every light-transmissive piece of the light distribution member, and are disposed on either the first main surface side or the second main surface side of the light distribution member. The reflecting layer is made of a material that is different from that of the light blocking films and is disposed between the light emitting elements (see FIG. 2B). In other words, the device has light emitting elements that are disposed separated from each other, light-transmissive pieces that are provided on the emission surface side of these light emitting elements, light blocking films (light blocking members) that bond adjacent light-transmissive pieces, and a reflecting layer that is disposed between adjacent light emitting elements.

This configuration allows the light emitted from individual light emitting elements to be separated from one light emitting element to the next, and prevents light leakage between adjacent light emitting elements within the light emitting device. As a result, slight light-emission by unlit light emitting elements can be avoided.

The method for manufacturing a light distribution member and the method for manufacturing a light emitting device according to embodiments of the present invention will now be described in detail through reference to the drawings.

Embodiment 1: Method for Manufacturing a Light Distribution Member

With the method for manufacturing a light distribution member in Embodiment 1, first a light-transmissive board $10a$ is prepared, as shown in FIG. 1A (a). This light-transmissive board $10a$ is obtained by using a large YAG board obtained by mixing a YAG fluorescent material in an amount of about 10 wt % into a glass material and sintering, and then cutting this into a suitable size.

As shown in FIG. 1A (b), a first light blocking film 11 having a DBR structure, composed of ($Nb_2O_5$ (lower layer)/ $SiO_2$ (upper layer))n (n=20), and having a thickness of 1.5/2.5 µm (total thickness of 80 µm), is successively formed by sputtering, and two first light blocking film members 17 are thus formed. Also, a plurality of the first light blocking film members 17 are formed in which the first light blocking films 11 are formed on both sides of the light-transmissive board $10a$.

Then, as shown in FIG. 1A (c), the first light blocking film members 17 are successively bonded at room temperature to form a first bonded body 18 in which, for example, four of the first light blocking film members 17 are stacked. In this case, a surface on which no first light blocking film 11 has been formed is disposed on the surfaces of the first bonded body 18 located at the lowermost and uppermost surfaces.

After this, as shown in FIG. 1A (d), the first bonded body 18 is sliced to the desired thickness by being cut in a direction perpendicular to the lamination surface of the first light blocking film members 17. This cutting is performed parallel to the end face 19 of the first bonded body 18 (see FIG. 1A (c)). After this, polishing is performed to smooth the surface.

Figure 1B:
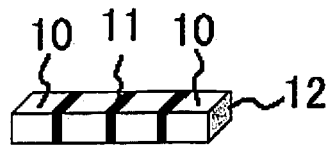
FIG. 1B is an oblique view of the light distribution member obtained with the method for manufacturing a light distribution member of the present invention.

As shown in FIG. 1B, this forms light distribution members 12 that have the desired thickness and each comprise a row light-transmissive pieces 10 and first light blocking films 11 that bond adjacent light-transmissive pieces 10.

As shown in FIGS. 1A and 1B, the thickness of the light-transmissive board $10a$ can be eventually a maximum width for the deposition of the light emitting element. Thus, the thickness of the light-transmissive board $10a$ is preferably greater than the length of one side (width) of a light emitting element in plan view, and can be, for example, at least 50 µm larger than one side of a light emitting element.

With this light distribution member, because a DBR structure is utilized as the first light blocking films that bond light-transmissive pieces, a higher light reflectivity is obtained, and the light blocking effect can be further enhanced. Also, since the light absorptivity is low, even in the case where these light blocking films are used for the light distribution member, a decrease in the light flux of the light distribution member can be avoided.

Embodiment 2: Method for Manufacturing a Light Emitting Device

Figure 2A:
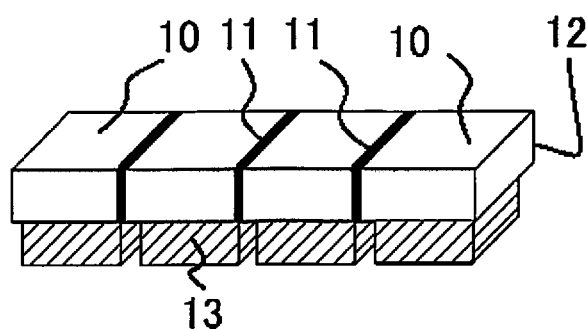
FIG. 2A is manufacturing processing diagram showing an embodiment of the method for manufacturing a light emitting device of the present invention.

With the method for manufacturing a light emitting device in Embodiment 2, first, as shown in FIG. 2A, light emitting elements 13 are disposed corresponding to the light distribution members 12 obtained in Embodiment 1. That is, four light emitting elements 13 are disposed spaced apart from each other corresponding to the locations of the light-transmissive pieces 10 demarcated by the first light blocking films 11 of the light distribution members 12.

The layout of the light emitting elements 13 is accomplished by arranging the light emitting elements 13 in a row on a support substrate having a wiring pattern formed on its surface, and mounting them in face-down manner using solder. The light distribution members 12 are then fixed with an adhesive member to the light extraction surface side of the light emitting elements 13 thus laid out.

Figure 2B:
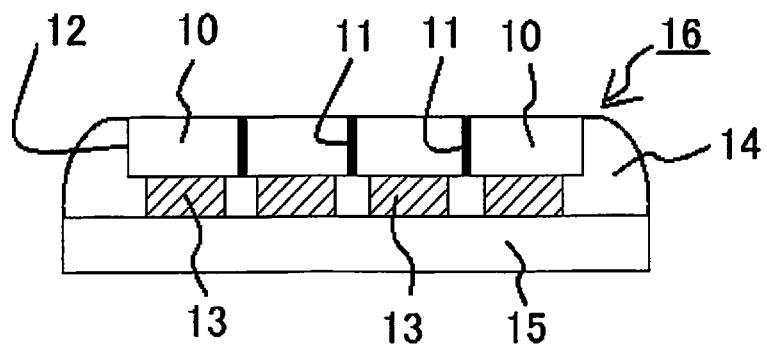
FIG. 2B is manufacturing processing diagram showing an embodiment of the method for manufacturing a light emitting device of the present invention.

As shown in FIG. 2B, a light emitting device 16 is then formed by disposing a reflecting layer 14 made of silicone resin containing about 50% titanium oxide, so that the reflecting layer 14 is disposed between the light emitting elements 13. The reflecting layer 14 comes into contact with the first light blocking films 11 on the light distribution member 12 side, between the light emitting elements 13. Also, the reflecting layer 14 is disposed so as to cover the entire side surface of the light emitting elements 13. The reflecting layer 14 is disposed around the outside of the light emitting device 16 so as to cover the entire side face of the light emitting elements 13 and the entire end face of the light distribution members 12.

The light emitting device obtained by this manufacturing method has, for example, the sheet-form light distribution member 12 that has a first main surface and a second main surface that are parallel to each other and are located on mutually opposite sides, and that has light-transmissive pieces 10 and first light blocking films 11 disposed alternately with respect to a specific direction parallel to the first main face and second main face; a plurality of the light emitting elements 13 that are spaced apart at every light-transmissive piece 10 of this light distribution member 12, and that are disposed on either the first main face side or the second main face side of the light distribution member 12; and the reflecting layer 14 that is made of a material that is different from that of the first light blocking films 11 and is disposed between the light emitting elements 13.

In other words, the device comprises the light emitting elements 13 that are disposed separated from each other, the light-transmissive pieces 10 that are provided on the emission surface side of these light emitting elements 13, the first light blocking films 11 that bond adjacent light-transmissive pieces 10, and the reflecting layer 14 that is disposed between adjacent light emitting elements 13.

With the manufacturing method discussed above, there is no need to form a reflecting or light blocking film on the side faces of the light distribution member, and a light distribution member and a light emitting device can be manufactured easily and accurately.

Also, the resulting light emitting device is such that when the individual light emitting elements are independently lit, light leakage from a lit light emitting element to an unlit light emitting element adjacent to the lit light emitting element can be avoided, which prevents slight light-emission by the unlit light emitting element. Further, since the light distribution member located on the boundary between the light emitting elements can be an extremely thin film, even if adjacent light emitting elements emit light at the same time, uniform brightness can be maintained even at their boundary. In addition, a more compact and brighter light emitting device can be obtained by disposing light emitting elements more densely.

Embodiment 3: Method for Manufacturing a Light Distribution Member

The method for manufacturing a light distribution member in Embodiment 3 is substantially the same as the method for manufacturing a light distribution member in Embodiment 1, except that the light-transmissive board is cut in two directions.

First, as shown in FIG. 3A (a), a light-transmissive board 20a is prepared.

Then, as shown in FIG. 3A (b), a first light blocking film 21 having a DBR structure is formed on the surface of this light-transmissive board 20a, thereby forming a first light blocking film member 27. The width of the first light blocking film member 27 here is about 200 μm, for example.

Next, as shown in FIG. 3A (c), the first light blocking film members 27 are successively bonded at room temperature so as to sandwich the first light blocking films 21, thereby forming a first bonded body 28 in which four (for example) of the first light blocking film members 27 are stacked.

After this, as shown in FIG. 3A (d), the first bonded body 28 is sliced by making a first cut in a direction perpendicular to the lamination face of the first light blocking film members 27.

As shown in FIG. 3B (a), another cut is made to the sliced light distribution members 22a in a direction that is in a direction perpendicular to the lamination face of the first light blocking film member, and that is in a direction perpendicular to the above-mentioned first cut at the lamination face of the first light blocking film member 27.

Thus making cuts in two directions allows a plurality of the light distribution members 22 to be manufactured in the desired shape as shown in FIG. 3B (b).

As shown in FIG. 3A, when cuts are thus made in two directions, the light-transmissive board 20a should have a certain amount of depth.

According to such a manufacturing method, as in Embodiment 1, light distribution members which can avoid light leakage at adjacent light emitting elements can be mass-produced by a method that is accurate and simple.

Embodiment 4: Method for Manufacturing a Light Distribution Member

The method for manufacturing a light distribution member in Embodiment 4 differs from Embodiment 3 in that the light distribution members 22a, as shown in FIG. 3A (d), are further processed by slicing the first bonded body 28 by making a first cut in a direction perpendicular to the lamination surfaces of the first light blocking film members 27.

Figure 4A:
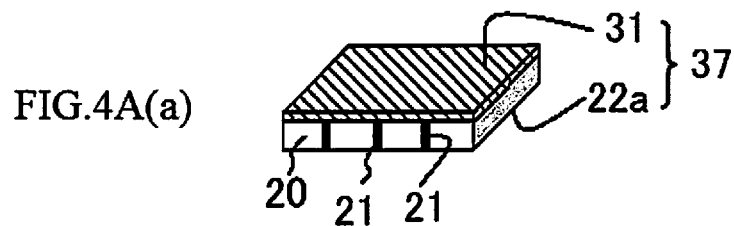
FIG. 4A(a) to FIG. 4A(c) is manufacturing processing diagram showing another embodiment of the method for manufacturing a light emitting device of the present invention.
Figure 4A:
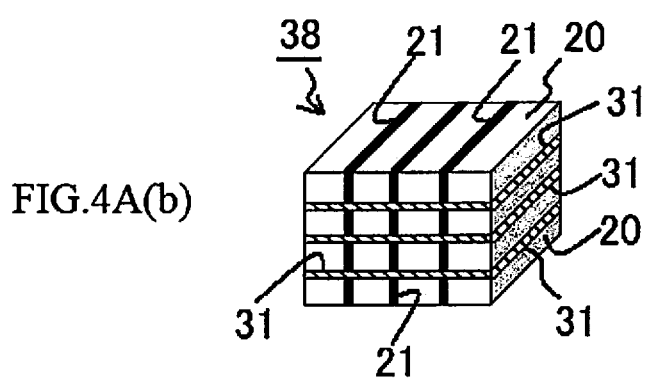
Figure 4A:
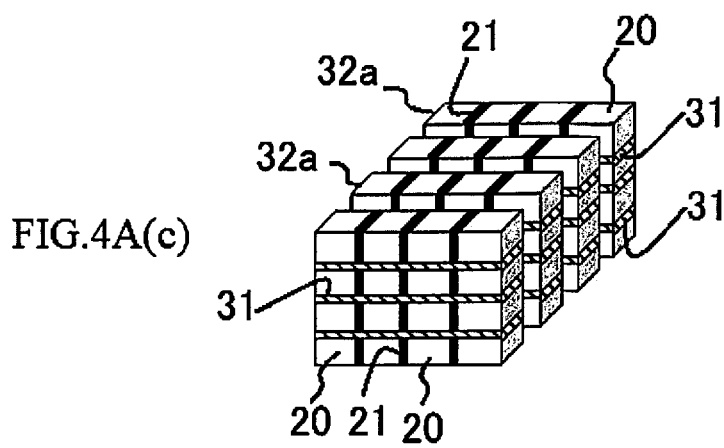

That is, as shown in FIG. 4A (a), just as in the formation of the first light blocking films 21, second light blocking films 31 with a DBR structure are formed on the surfaces of the resulting light distribution members 22a, thereby forming a second light blocking film member 37.

Next, as shown in FIG. 4A (b), the first light blocking film members 37 are successively bonded at room temperature so as to sandwich the first light blocking films 31, thereby forming a first bonded body 38 in which four (for example) of the first light blocking film members 37 are stacked.

Then, as shown in FIG. 4A (c), the first bonded body 38 is sliced by making a cut in a direction perpendicular to the lamination surface of the first light blocking film members 37, thereby forming light distribution members 32a.

Figure 4B:
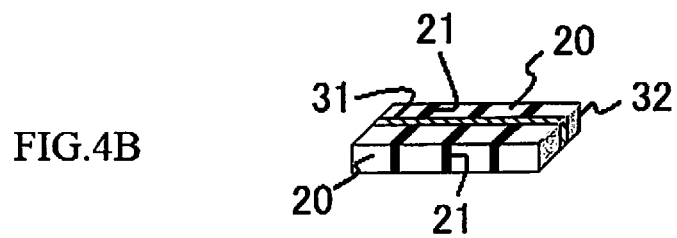
FIG. 4B is oblique view of another light distribution member obtained with the method for manufacturing a light distribution member of the present invention.

After this, the resulting light distribution members 32a are optionally polished and/or cut to obtain light distribution members 32 of the desired shape as shown in FIG. 4B, for example. A plurality of these light distribution members 32 are disposed with the light-transmissive pieces 20 arranged in a matrix.

According to the manufacturing method, as in Embodiments 1 and 3, light distribution members which can avoid light leakage at adjacent light emitting elements can be mass-produced by a method that is accurate and simple.

Embodiment 5: Method for Manufacturing a Light Emitting Device

Figure 5A:
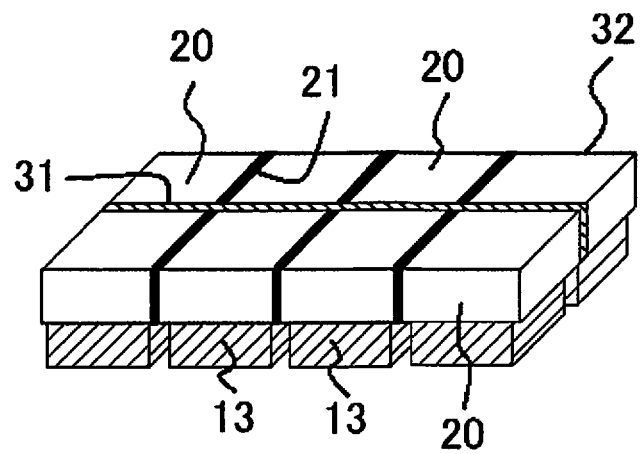
FIG. 5A is manufacturing processing diagram showing an embodiment of the method for manufacturing a light emitting device of the present invention.

With the method for manufacturing a light emitting device in Embodiment 5, as shown in FIG. 5A, a plurality of the light emitting elements 13 are arranged in a matrix corresponding to the light distribution members 32 obtained in Embodiment 4.

The arrangement of the light emitting elements 13 here can be the same as in Embodiment 2, and a light emitting device can be manufactured by forming a reflecting layer by a method similar to that in Embodiment 2.

Figure 5B:
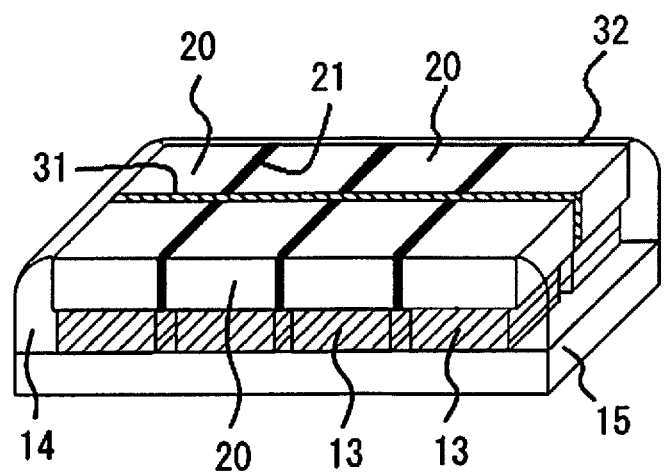
FIG. 5B is manufacturing processing perspective diagram showing an embodiment of the method for manufacturing a light emitting device of the present invention.

That is, as shown in FIG. 5B, the reflecting layer 14 comes into contact with the first light blocking films 21 and the second light blocking films 31 on the light distribution member 20 side, between the light emitting elements 13. In FIG. 5B, the reflecting layer 14 is shown in the perspective form for explaining in an easy-to understand.

The light emitting device obtained with this manufacturing method has substantially the same configuration as the light emitting device in Embodiment 2, except that the light emitting elements are disposed in a matrix, and the light-transmissive pieces, the first light blocking films, and the second light blocking films are disposed corresponding to these light emitting elements.

The similar effect is obtained with this light emitting device as with the one in Embodiment 2.

INDUSTRIAL APPLICABILITY

A method for manufacturing a light distribution member, and to a method for manufacturing a light emitting device according to the present disclosure can be suitably employed for a manufacturing method of various light sources, such as light sources for various display apparatuses, light sources for lighting, light sources for various indicators, light sources for automobile, a light source for display, backlight source for a liquid crystal display device, signals, components for automobile, channel latter for advertising display, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method for manufacturing a light distribution member, comprising:
   providing a plurality of first light blocking film members, each of which including a first light blocking film covering a surface of a light-transmissive board, the first light blocking film being a laminated film including a distributed Bragg reflector film on a light-transmissive board side and a metal film on an outer side;
   bonding the first light blocking film members by directly bonding the metal films of the first light blocking films of adjacent ones of the first light blocking film members by an atomic diffusion bonding or a surface activation bonding, such that the first light blocking films are sandwiched between the light-transmissive boards of the adjacent ones of the first light blocking film members, to form a first bonded body; and
   cutting the first bonded body in a direction perpendicular to a lamination surface of the first light blocking film members so as to form a plurality of slices.

2. The method for manufacturing a light distribution member according to claim 1, further comprising, after cutting the first bonded body:
   forming a plurality of second light blocking film members by covering cut surfaces of the slices with second light blocking films,
   bonding a plurality of second light blocking film members, such that each second light blocking film is sandwiched between the slices of adjacent second light blocking film members, to form a second bonded body, and
   cutting the second bonded body in a direction perpendicular to a lamination surface of the second light blocking film members and the lamination surface of the first light blocking film members so as to form a plurality of slices.

3. The method for manufacturing a light distribution member according to claim 2, wherein
   the second light blocking film is made from the same material as the first light blocking film.

4. The method for manufacturing a light distribution member according to claim 2, wherein
   the second light blocking film is made from a dielectric multilayer film, a single layer of metal, or a multilayer film of metal.

5. The method for manufacturing a light distribution member according to claim 2, wherein
   the atomic diffusion bonding or the surface activation bonding is performed at room temperature.

6. The method for manufacturing a light distribution member according to claim 1, wherein
   the light-transmissive board contains fluorescent materials.

7. The method for manufacturing a light distribution member according to claim 1, wherein
   the first light blocking film covers one side or both sides of the light-transmissive board.

8. The method for manufacturing a light distribution member according to claim 1, wherein
   the atomic diffusion bonding or the surface activation bonding is performed at room temperature.

9. A method of manufacturing a light emitting device, comprising:
   providing a plurality of first light blocking film members, each of which including a first light blocking film covering a surface of a light-transmissive board, the first light blocking film being a laminated film including a distributed Bragg reflector film on a light-transmissive board side and a metal film on an outer side;
   bonding the first light blocking film members by directly bonding the metal films of the first light blocking films of adjacent ones of the first light blocking film members by an atomic diffusion bonding or a surface activation bonding, such that the first light blocking films are sandwiched between the light-transmissive boards of the adjacent ones of the first light blocking film members, to form a first bonded body;
   cutting the first bonded body in a direction perpendicular to a lamination surface of the first light blocking film members to form a plurality of slices each constituting a light distribution member;
   disposing light emitting elements separately from each other with respect to light-transmissive pieces that have been demarcated by the first light blocking films in the light distribution member; and
   disposing reflecting layers made from a material that is different from that of the first light blocking film between the light emitting elements.

10. The method for manufacturing a light emitting device according to claim 9, wherein
   disposing the light emitting elements includes:
   disposing a plurality of light emitting elements in a row with respect to the light-transmissive pieces that have been arranged in a row in the light distribution member.

11. The method for manufacturing a light emitting device according to claim 9, wherein
   the reflecting layer is made of a white resin.

12. The method for manufacturing a light emitting device according to claim 9, wherein
   the reflecting layers are disposed so that the reflecting layers come into contact with the first light blocking films on the light distribution member side.

13. A method of manufacturing a light emitting device comprising:
   providing a plurality of first light blocking film members, each of which including a first light blocking film covering a surface of a light-transmissive board, the first light blocking film being a laminated film including a distributed Bragg reflector film on a light-transmissive board side and a metal film on an outer side;

bonding the first light blocking film members by directly bonding the metal films of the first light blocking films of adjacent ones of the first light blocking film members by an atomic diffusion bonding or a surface activation bonding, such that the first light blocking films are sandwiched between the light-transmissive boards of the adjacent ones of the first light blocking film members, to form a first bonded body;

cutting the first bonded body in a direction perpendicular to a lamination surface of the first light blocking film members to form a plurality of slices;

forming a plurality of second light blocking film members by covering cut surfaces of the slices with second light blocking films;

bonding a plurality of second light blocking film members including sandwiching each second light blocking film between the slices of adjacent second light blocking film members, to form a second bonded body;

cutting the second bonded body in a direction perpendicular to a lamination surface of the second light blocking film members and the lamination surface of the first light blocking film members to form a plurality of slices each constituting a light distribution member;

disposing light emitting elements separately with respect to light-transmissive pieces that have been demarcated by the first light blocking films and the second light blocking films in the light distribution member; and disposing reflecting layers made from a material that is different from that of the first light blocking film and the second light blocking film between the light emitting elements.

14. The method for manufacturing a light emitting device according to claim 13, wherein disposing the light emitting elements includes:

disposing a plurality of light emitting elements in a matrix with respect to the light-transmissive pieces that have been arranged in a matrix in the light distribution member.

15. The method for manufacturing a light emitting device according to claim 13, wherein the reflecting layer is made of a white resin.

16. The method for manufacturing a light emitting device according to claim 13, wherein the reflecting layers are disposed so that the reflecting layers come into contact with the first light blocking films and the second light blocking films on the light distribution member side.

\* \* \* \* \*

UNITED STATES PATENT AND TRADEMARK OFFICE
CERTIFICATE OF CORRECTION

PATENT NO. : 9,744,754 B2
APPLICATION NO. : 14/543382
DATED : August 29, 2017
INVENTOR(S) : Dai Wakamatsu et al.

It is certified that error appears in the above-identified patent and that said Letters Patent is hereby corrected as shown below:

On the Title Page

Please change the listing of item [72] from:
[72] Inventors: Dai Wakamatsu, Tokushima (JP); Masatsugu Ichikawa, Tokushima (JP)
To:
-- [72] Inventors: Dai Wakamatsu, Itano-gun (JP); Masatsugu Ichikawa, Tokushima-shi (JP) --

Signed and Sealed this
Fifth Day of June, 2018

Andrei Iancu
*Director of the United States Patent and Trademark Office*